United States Patent [19]

Kaneiwa et al.

[11] Patent Number: 4,745,615
[45] Date of Patent: May 17, 1988

[54] SEMICONDUCTOR LASER DEVICE WITH A DIFFRACTION GRATING

[75] Inventors: Shinji Kaneiwa, Nara; Haruhisa Takiguchi, Osaka; Toshihiko Yoshida; Sadayoshi Matsui, both of Tenri, all of Japan

[73] Assignee: Sharp Kabushiki Kaisha, Osaka, Japan

[21] Appl. No.: 789,787

[22] Filed: Oct. 21, 1985

[30] Foreign Application Priority Data

Oct. 22, 1984 [JP] Japan ................... 59-223576

[51] Int. Cl.$^4$ ................................. H01S 3/19
[52] U.S. Cl. ........................... 372/96; 372/45
[58] Field of Search ............ 372/44, 45, 46, 96

[56] References Cited

U.S. PATENT DOCUMENTS 4,575,851  3/1986  Seki et al. .................... 372/45
4,704,720  11/1987  Yamaguchi .................... 372/45

FOREIGN PATENT DOCUMENTS 58-197788  11/1983  Japan.

OTHER PUBLICATIONS

H. Watanabe et al., "(Invited) InGaAsP Visible Laser Crystal", Japanese Journal of Applied Physics, Supp., vol. 22, supp. 22-1, 1983, pp. 315-320.
M. Razeghi et al., "CW Operation of . . . ", Applied Physics Letters, vol. 45, No. 7, 10/1/84, pp. 784-786.
K. Wakao et al., "Low-threshold . . . ", Electronics Letters, vol. 20, No. 9, 4/26/84, pp. 374-375.

*Primary Examiner*—James W. Davie
*Attorney, Agent, or Firm*—Birch, Stewart, Kolasch & Birch

[57] ABSTRACT

A semiconductor laser device for laser oscillation at a wavelength in the range of from 660 nm to 890 nm which includes an active layer of $Ga_{1-x}Al_xAs$ ($0 \leq x \leq 0.4$) or $In_{1-y}Ga_yP_{1-z}As_z$ ($0.51 \leq y \leq 1$, $0 \leq z \leq 1$, and $z = 2.04y - 1.04$) and a layer with a diffraction grating thereon of $In_{1-y}Ga_yP_{1-z}As$ ($z = 2.04y - 1.04$) which is adjacent to the active layer.

20 Claims, 2 Drawing Sheets

SEMICONDUCTOR LASER DEVICE WITH A DIFFRACTION GRATING

BACKGROUND OF THE INVENTION

1. Field of the Invention

This invention relates to a distributed feedback semiconductor laser device and a distributed Bragg reflection semiconductor laser device which attains laser oscillation at a wavelength ranging from 660 to 890 nm in a single longitudinal mode.

2. Description of the Prior Art

Semiconductor laser devices, which are used as light sources for optical information processing systems and optical measurement systems utilizing optical fibers therein, are required to have operation characteristics achieving laser oscillation in a single longitudinal mode. Laser devices are known which achieve laser oscillation in a single longitudinal mode, such as distributed feedback semiconductor lasers and distributed Bragg reflection semiconductor lasers which have a diffraction grating with a periodic corrugation on or near the active region.

FIG. 3 shows a typical conventional distributed feedback semiconductor laser, which comprises an n-InP substrate 10, an n-InP cladding layer (buffer layer) 20, a non-doped InGaPAs active layer 30, a p-InGaPAs optical guiding layer 40, a p-InP cladding layer 50 and a p-InGaPAs cap layer 60, in sequence. A p-side ohmic electrode 70 and an n-side ohmic electrode 80 are disposed on the cap layer 60 and the substrate 10, respectively. A diffraction grating 401 for laser oscillation is formed on the upper surface of the optical guiding layer 40. This laser device utilizes the InGaPAs-InP system which achieves laser oscillation at a wavelength of as long as 1,300 nm.

On the other hand, a semiconductor laser device attaining laser oscillation at a shorter wavelength of 890 nm or less comprises, as shown in FIG. 4, an n-GaAs substrate 100, an n-GaAlAs cladding layer 200, a non-doped GaAs or GaAlAs active layer 300, a p-GaAlAs optical guiding layer 400, a p-GaAlAs cladding layer 500 and a p-GaAs cap layer 600, in sequence. However, this laser has the GaAlAs cladding layer 500 on a diffraction grating 401 which is formed on the GaAlAs optical guiding layer 400, so that the GaAlAs alloy crystal is readily oxidized in the atmoshere in the formation process of the diffraction grating 401 to thereby from an oxide film on the GaAlAs optical guiding layer 400 which makes it difficult to grow the succeeding crystal (i.e, the GaAlAs cladding layer 500) thereon. This, it can be said that semiconductor lasers having a diffraction grating therein for laser oscillation at a wavelength of as short as 890 nm or less have not yet been sufficiently developed.

SUMMARY OF THE INVENTION

The semiconductor laser device of this invention which overcomes the above-discussed and numerous other disadvantages and deficicencies of the prior art, comprises an active layer consisting of $Ga_{1-x}Al_xAs$ ($0 \leq x \leq 0.4$) or $In_{1-y}Ga_yP_{1-z}As_z$ ($0.51 \leq y \leq 1$, $0 \leq z \leq 1$, and $z = 2.04y - 1.04$) and a layer with a diffraction grating thereon consisting of $In_{1-y}Ga_yP_{1-z}As$ ($z = 2.04y - 1.04$) which is adjacent to said active layer.

The layer having the diffraction grating is, in a preferred embodiment, an optical guiding layer.

Thus, the invention described herein makes possible the objects of (1) providing a distributed feedback semiconductor laser device and/or a distributed Bragg reflection semiconductor laser device which attains laser oscillation at a wavelength of 890 nm or less; (2) providing a semiconductor laser device of high quality in which an InGaPAs crystal is used as a diffraction grating material instead of a GaAlAs crystal, so that the succeeding crystal growth on the diffraction grating can be readily attained resulting in excellent laser characteristics; and (3) providing a distributed feedback semiconductor laser device and/or a distributed Bragg reflection semiconductor laser device which attains laser oscillation in a single longitudinal mode at an oscillation wavelength ranging from 660 to 890 nm.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS (Example 1)

Figure 1:
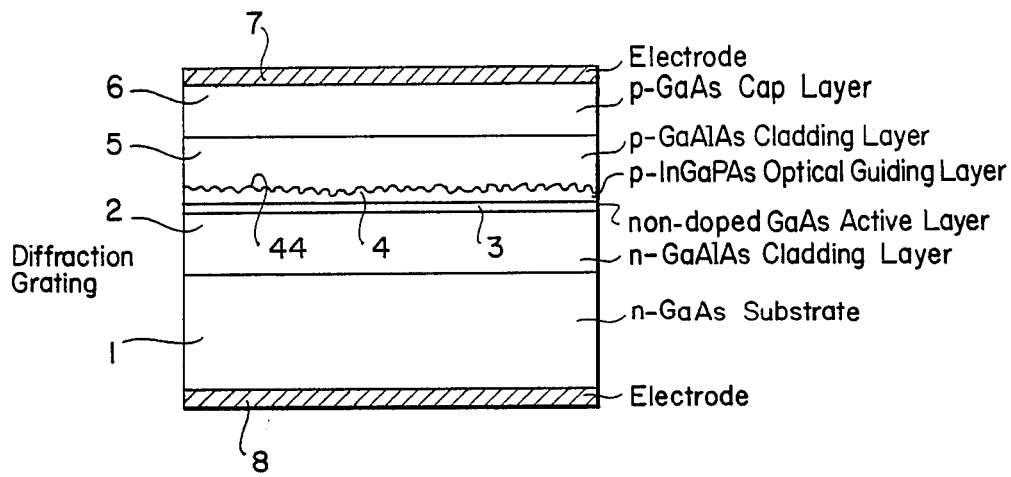
FIG. 1 is a cross sectional view showing a distributed feedback semiconductor laser device of this invention.

FIG. 1 shows a distributed feedback semiconductor laser device of this invention, which is fabricated as follows: On an N-GaAs substrate 1, an n-GaAlAs cladding layer 2, a non-doped GaAs active layer 3 and a p-InGaPAs optical guiding layer 4 are successively grown by liquid phase epitaxy. The optical guiding layer 4 is a quaternary alloy crystal. Both the width of the forbidden band and the refractive index of the optical guiding layer 4 lies between that of the active layer 3 and that of the cladding layer 2. On the optical guiding layer 4, a photo-resist is then coated to form a photo-resist film which is then subjected to an interference exposure treatment using an ultraviolet ray, resulting in a diffraction grating of the photo-resist film with 2500 Å intervals. Grooves are formed on the optical guiding layer 4 by a chemical etching technique, using the resulting photoresist diffraction grating as a mask, and then the photo-resist film is removed, resulting in a diffraction grating 44 with a corrugation having a periodicity of 2500 Å on the optical guiding layer 4. Then, on the optical guiding layer 4 having the diffraction grating 44 thereon, a p-GaAlAs cladding layer 5 and a p-GaAs cap layer 6 are successively grown by liquid phase epitaxy. Ohmic metal electrodes 7 and 8 are then formed on the cap layer 6 and the substrate 1, respectively.

In this Example, the multi-layered double-heterostructure laser operation includes the active layer 3 of GaAs and the cladding layers 2 and 5 of an alloy crystal of $Ga_{1-x}Al_xAs$ (the composition ratio x being 0.2 or more), resulting in a semiconductor laser device having an oscillation wavelength of approximately 890 nm. The optical guiding layer 4 is a quaternary alloy crystal of $In_{1-y}Ga_yP_{1-z}As_z$, wherein $0.68 \leq y \leq 1$, $0.34 \leq z \leq 1$, and $z = 2.04y - 1.04$. The forbidden band width of the optical guiding layer 4 is set between that of the active layer 3 and that of each of the cladding layers 2 and 5. The refractive index of the optical guiding layer 4 is also set between that of the active layer 3 and that of each of the cladding layers 2 and 5.

In order to obtain a semiconductor laser device having an oscillation wavelength of 890 nm or less, it is preferable that the active layer 3 is composed of $Ga_{1-x}Al_xAs$ (wherein $0 \leq x \leq 0.4$) and the cladding layers 2 and 5 are composed of $Ga_{1-x}Al_xAs$ (wherein $0.2 \leq x \leq 1$), and moreover the cladding layer 2 and 5 have a higher bandgap energy than the active layer 3 by 0.3 eV or more. Semiconductor laser devices obtained under the above-mentioned conditions have an oscillation wavelength ranging from 660 to 890 nm. Moreover, semiconductor laser devices having an oscillation wavelength in the range of 660 to 890 nm, can be obtained even when a quaternary alloy crystal of $In_{1-y}Ga_yP_{1-z}As_z$ (wherein $0.51 \leq y \leq 1$, $0 \leq z \leq 1$, and $z = 2.04y - 1.04$) is employed as the active layer 3 and a quaternary alloy crystal of $In_{1-y}Ga_yP_{1-z}As_z$ (wherein $0.51 \leq y \leq 0.81$, $0 \leq z \leq 0.6$, and $z = 2.04y - 1.04$) is employed as each of the cladding layers 2 and 5. As the optical guiding layer 4, a quaternary alloy crystal of $In_{1-y}Ga_yP_{1-z}As_z$ (wherein $z = 2.04y - 1.04$) is used instead of GaAlAs because the oxidation of Al must be avoided, the composition ratios y and z of which are selected depending upon the kinds of materials of the cladding layers 2 and 5.

As mentioned above, since a quaternary alloy crystal of InGaPAs is used as the optical guiding layer 4, the surface of the optical guiding layer 4 is not oxidized in the formation of the diffraction grating 44 thereon so that the succeeding crystal growth on the optical guiding layer 4 can be readily attained, resulting in a high quality distributed feedback semiconductor laser device with high quality reproducibility.

When a carrier is injected into the semiconductor laser device through the p-side electrode 8 and the n-side electrode 7, laser operation begins in the active layer 3, resulting in an oscillation wavelength in the range of 660 to 890 nm. The resonance of the laser light arises in the side to side direction and the laser light is emitted from the facets which are positioned at both sides. The oscillation wavelength depends upon the periodic diffraction grating 44 formed on the optical guiding layer 4. The laser light is oscillated in a single longitudinal mode. Thus, this semiconductor laser device has output power characteristics which can be applied to a light source for optical information processing system using optical fibers. The structure of the distributed feedback semiconductor laser device of this Example is, of course, applicable to distributed Bragg reflection semiconductor laser devices.

(Example 2)

Figure 2:
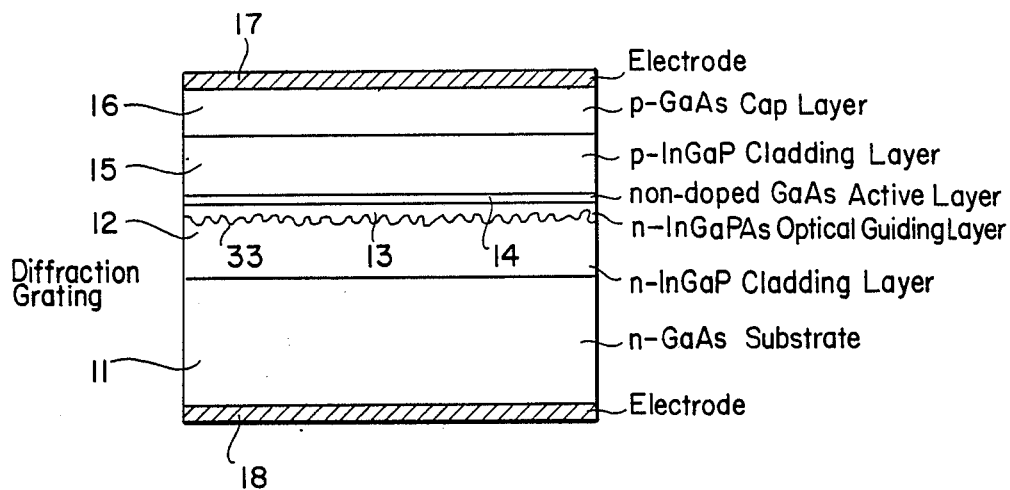
FIG. 2 is a cross sectional view showing another distributed feedback semiconductor laser device of this invention.
Figure 3:
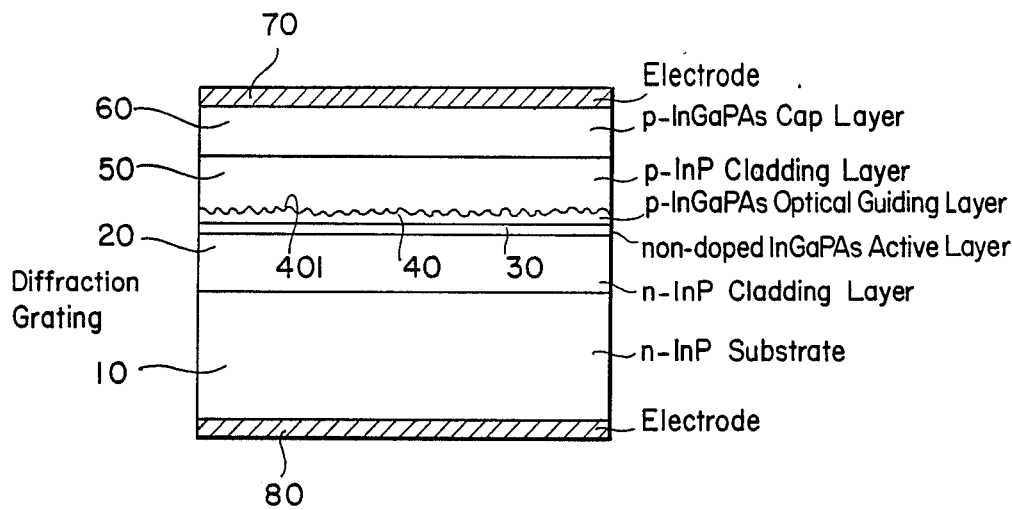
FIG. 3 is a cross sectional view showing a conventional distributed feedback semiconductor laser device attaining laser oscillation at a wavelength of 1,300 nm.
Figure 4:
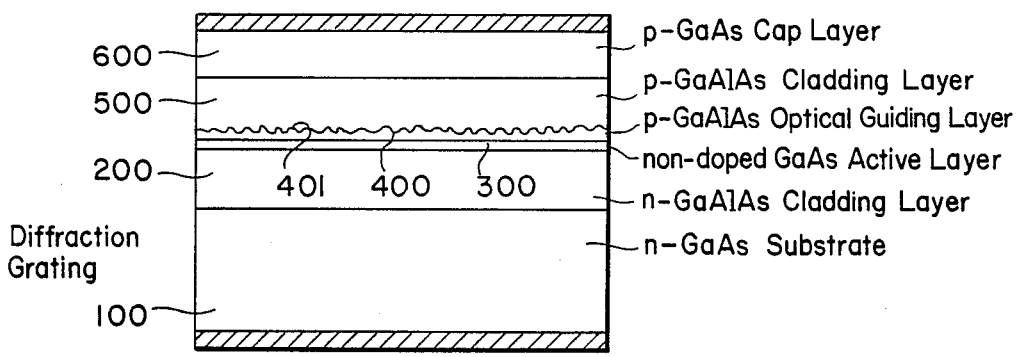
FIG. 4 is a cross sectional view showing a conventional semiconductor laser device attaining laser oscillation at a wavelength of 890 nm or less.

FIG. 2 shows another distributed feedback semiconductor laser device of this invention, which is fabricated as follows: On an n-GaAs substrate 11, an n-InGaP cladding layer 12 is grown. A diffraction grating 33 is then formed on the InGaP cladding layer 12 in the same manner as in Example 1, followed by the growth of an n-InGaPAs optical guiding layer 13, a non-doped GaAs active layer 14, a p-InGaP cladding layer 15 and a p-GaAs cap layer 16, in sequence, by an epitaxial growth technique. The semiconductor laser device in this Example is different from that in Example 1 in that the diffraction grating 33 is formed on the n-InGaP cladding layer 12 in this Example, while the diffraction grating 44 is formed on the InGaPAs optical guiding layer 4 in Example 1. The n-InGaP cladding layer 12 having the diffraction grating 33 thereon in this Example is not oxidized, as well, and accordingly the succeeding crystal growth on the diffraction grating 33 is readily attained. Then, ohmic metal electrodes 17 and 18 are formed on the cap layer 16 and the substrate 11, respectively, resulting in a semiconductor laser device. When a carrier is injected into the obtained semiconductor laser device through the ohmic metal electrodes 17 and 18, laser oscillation can be attained in a single longitudinal mode at an oscillation wavelength of 890 nm or less. Laser light is emitted from the facets at both sides.

As the active layer 14, an alloy crystal selected from GaAlAs, InGaPAs, etc., can be used, instead of GaAs, as described in Example 1. As the cladding layers 12 and 15, an alloy crystal selected from InGaPAs, etc., can be used, instead of InGaP, as described in Example 1. When an alloy crystal of $Ga_{1-x}Al_xAs$ is used for the active layer 12, the composition ratio x is selected to be $0 \leq x \leq 0.15$. When an alloy crystal of $In_{1-y}Ga_yP_{1-z}As_z$ is used for the active layer 12, the composition ratios y and z are selected to be $0.78 \leq y \leq 1$, $0.56 \leq z \leq 1$, and $z = 2.04y - 1.04$. The semiconductor laser devices containing the above-mentioned active layer 12 emit a laser light in the range of 890 to 770 nm. The structure of the distributed feedback semiconductor laser devices of this Example is, of course, applicable to distributed Bragg reflection semiconductor laser devices.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A semiconductor laser device, the improvment comprising:
   a multi-layer structure which includes,
   a first cladding layer,
   an active layer formed on said first cladding layer comprising $Ga_{1-x}Al_xAs$ wherein x satisfies the relation $0 \leq x \leq 0.4$,
   an optical guiding layer formed on said active layer comprising $In_{1-y}Ga_yP_{1-z}As_z$ wherein y and z satisfy the relations $0.51 \leq y \leq 1$, $0 \leq z \leq 1$, and $z = 2.04y - 1.04$ and wherein said optical guiding layer has a diffraction grating formed thereon, and
   a second cladding layer formed on said optical guiding layer,
   wherein said semiconductor laser device employing said multi-layer structure attains laser oscillation at a wavelength in the range of from 660 nm to 890 nm.

2. A semiconductor laser device according to claim 1, wherein said first cladding layer and said second cladding layer comprise $Ga_{1-x}Al_xAs$.

3. A semiconductor laser device according to claim 1, wherein said first cladding layer comprises $Ga_{1-x}Al_xAs$ and said second cladding layer comprises $In_{1-y}Ga_yP_{1-z}As_z$.

4. A semiconductor laser device according to claim 1, wherein said first cladding layer comprises $In_{1-y}Ga_yP_{1-z}As_z$ and said second cladding layer comprises $Ga_{1-x}Al_xAs$.

5. A semiconductor laser device according to claim 1, wherein said first cladding layer and second cladding layer comprise $In_{1-y}Ga_yP_{1-z}As_z$.

6. A semiconductor laser device, the improvement comprising:
a multi-layer structure which includes,
a first cladding layer,
an active layer formed on said first cladding layer comprising $In_{1-y}Ga_yP_{1-z}As_z$ wherein y and z satisfy the relations $0.51 \leq y \leq 1$, $0 \leq z \leq 1$, and $z = 2.04y - 1.04$,
an optical guiding layer formed on said active layer comprising $In_{1-y}Ga_yP_{1-z}As_z$ and having a diffraction grating formed thereon, and
a second cladding layer formed on said optical guiding layer,
wherein said semiconductor laser device employing said multi-layer structure attains laser oscillation at a wavelength in the range of from 660 nm to 890 nm.

7. A semiconductor laser device according to claim 6, wherein said first cladding layer and said second cladding layer comprise $Ga_{1-x}Al_xAs$.

8. A semiconductor laser device according to claim 6, wherein said first cladding layer comprises $Ga_{1-x}Al_xAs$ and said second cladding layer comprises $In_{1-y}Ga_yP_{1-z}As_z$.

9. A semiconductor laser device according to claim 8, wherein said first cladding layer comprises $In_{1-y}Ga_yP_{1-z}As_z$ and said second cladding layer comprises $Ga_{1-x}Al_xAs$.

10. A semiconductor laser device according to claim 6, wherein said first cladding layer and second cladding layer comprises $In_{1-y}Ga_yP_{1-z}As_z$.

11. A semiconductor laser device, the improvement comprising:
a multi-layer structure which includes,
a first cladding layer comprising $In_{1-y}Ga_yP_{1-z}As_z$ wherein y and z satisfy the relations $0.51 \leq y \leq 1$, $0 \leq z \leq 1$, and $z = 2.04y - 1.04$ and wherein said first cladding layer has a diffraction grating formed thereon,
an optical guiding layer formed on said first cladding layer,
an active layer comprising $Ga_{1-x}Al_xAs$ wherein x satisfies the relation $0 \leq x \leq 0.4$, and
a second cladding layer formed on said active layer,
wherein said semiconductor laser device employing said multi-layer structure attains laser oscillation at a wavelength in the range of from 660 nm to 890 nm.

12. A semiconductor laser device according to claim 11, wherein said optical guiding layer and said second cladding layer comprise $Ga_{1-x}Al_xAs$.

13. A semiconductor laser device according to claim 11, wherein said optical guiding layer comprises $Ga_{1-x}Al_xAs$ and said second cladding layer comprises $In_{1-y}Ga_yP_{1-z}As_z$.

14. A semiconductor laser device according to claim 11, wherein said optical guiding layer comprises $In_{1-y}Ga_yP_{1-z}As_z$ and said second cladding layer comprises $Ga_{1-x}Al_xAs$.

15. A semiconductor laser device according to claim 11, wherein said optical guiding layer and second cladding layer comprise $In_{1-y}Ga_yP_{1-z}As_z$.

16. A semiconductor laser device, the improvement comprising:
a multi-layer structure which includes,
a first cladding layer comprising $In_{1-y}Ga_yP_{1-z}As_z$ wherein y and z satisfy the relations $0.51 \leq y \leq 1$, $0 \leq z \leq 1$, and $z = 2.04y - 1.04$ and wherein said first cladding layer has a diffraction grating formed thereon,
an optical guiding layer formed on said first cladding layer,
an active layer formed on said optical guiding layer comprising $In_{1-y}Ga_yP_{1-z}As_z$, and
a second cladding layer formed on said active layer,
wherein said semiconductor laser device employing said multi-layer structure attains laser oscillation at a wavelength in the range of from 660 nm to 890 nm.

17. A semiconductor laser device according to claim 16, wherein said optical guiding layer and said second cladding layer comprise $Ga_{1-x}Al_xAs$.

18. A semiconductor laser device according to claim 16, wherein said optical guiding layer comprises $Ga_{1-x}Al_xAs$ and said second cladding layer comprises $In_{1-y}Ga_yP_{1-z}As_z$.

19. A semiconductor laser device according to claim 16, wherein said optical guiding layer comprises $In_{1-y}Ga_yP_{1-z}As_z$ and said second cladding layer comprises $Ga_{1-x}Al_xAs$.

20. A semiconductor laser device according to claim 16, wherein said optical guiding layer and second cladding layer comprise $In_{1-y}Ga_yP_{1-z}As_z$.

* * * * *